(12) United States Patent
Dansky et al.

(10) Patent No.: US 6,418,401 B1
(45) Date of Patent: Jul. 9, 2002

(54) EFFICIENT METHOD FOR MODELING THREE-DIMENSIONAL INTERCONNECT STRUCTURES FOR FREQUENCY-DEPENDENT CROSSTALK SIMULATION

(75) Inventors: Allan H. Dansky, Poughkeepsie; Alina Deutsch, Chappaqua; Gerard V. Kopcsay, Yorktown Heights; Phillip J. Restle, Katonah; Howard H. Smith, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/248,667

(22) Filed: Feb. 11, 1999

(51) Int. Cl.⁷ .............................. G06F 17/50
(52) U.S. Cl. .................. 703/27; 703/13; 703/19; 716/4; 716/6
(58) Field of Search ................ 703/13, 19, 4, 703/27; 716/5, 4, 6, 8

(56) References Cited

U.S. PATENT DOCUMENTS

| | | | | |
|---|---|---|---|---|
| 5,313,398 A | * | 5/1994 | Rohrer et al. ............... | 364/468 |
| 5,706,477 A | * | 1/1998 | Goto .......................... | 395/500 |
| 6,028,989 A | * | 2/2000 | Dansky et al. .......... | 395/500.09 |
| 6,342,823 B1 | * | 1/2002 | Dansky et al. ................. | 333/1 |

OTHER PUBLICATIONS

"Frequency–dependent Crosstalk Modeling for On–chip Interconnections", by A. Deutsch, et al., Proceedings IEEE 7th Topical Meeting on Electrical Packaging, Oct. 26–28, 1998, West Point, NY, pp. 35–38.

"High–speed propagation on lossy transmission lineso", by A. Deutsch, et al., IBM Journal Research and Development, vol. 34, No. 4, pp. 601–615, Jul. 1990.

"Pulse, Digital, and Switching Waveforms", by J. Millman, et al., Chapter 2, pp. 27–50, McGraw–Hill Book Co., NY 1965.

"Calculation of Mullti–Port Parameters of Electronic Packages Using a General Purpose Electromagnetic Code", by B.J. Rubin, et al., Proceedings of the 2nd IEEE Topical Meeting on Electrical Performance of Electronic Packaging, EPEP'93, Oct. 20–22, 1993, Monterey, CA, pp. 37–39.

"System and Method for Reducing Calculation Complexity of Lossy, Frequency–Dependent Transmission–Line Computation", by A. Deutsch, et al., YO998–156, filed Aug. 26, 1998.

"Resistive and Inductive Skin Effect in Rectangular Conductors", by W. T. Weeks, et al., IBM Journal Res. and Develop., vol. 23, pp. 652–660, 1979.

\* cited by examiner

Primary Examiner—Kevin J. Teska
Assistant Examiner—T. Phan
(74) Attorney, Agent, or Firm—Scully, Scott, Murphy & Presser; Daniel P. Morris, Esq.

(57) ABSTRACT

A method for reducing the computation time and improving the productivity in designing high-performance microprocessor chips that have no failures—due to crosstalk noise. The technique allows a very fast calculation of tables of frequency-dependent circuit parameters needed for accurate crosstalk prediction on lossy on-chip interconnections. These tables of parameters are the basis for CAD tools that perform crosstalk checking on >10K critical nets on typical microprocessor chips. A fast table generation allows for rapid incorporation of design or processing changes and transition to more advanced technologies.

12 Claims, 17 Drawing Sheets

7-Layer BEOL M7-M7 width=space=1.26um

| freq. (GHz) | 91<br>2D<br>R11 | 100<br>Δ | 92<br>3D<br>R11 | 93<br>2D'<br>R12 | 101<br>Δ | 94<br>3D'<br>R12 |
|---|---|---|---|---|---|---|
| | | | (ohm/cm) | | | |
| dc | 134.92 | | 134.92 | | | |
| 0.001 | 135.99 | +0.83% | 137.13 | 1.0734 | +11.3% | 1.1950 |
| 0.010 | 136.00 | +0.93% | 137.27 | 1.0826 | +17.2% | 1.2690 |
| 0.100 | 136.89 | +1.45% | 138.87 | 1.9620 | +46.4% | 2.8730 |
| 0.300 | 141.84 | +1.03% | 146.11 | 6.8913 | +46.3% | 10.080 |
| 1.000 | 153.06 | +2.13% | 156.33 | 17.835 | +12.1% | 19.993 |
| 3.500 | 161.84 | +1.62% | 164.46 | 24.986 | +5.60% | 26.373 |
| 10.00 | 171.07 | +1.03% | 176.33 | 29.458 | +12.0% | 32.990 |
| Inf. | Inf. | Inf. | Inf. | Inf. | Inf. | Inf. |

| freq. (GHz) | 95<br>2D<br>L11 | 102<br>Δ | 96<br>3D<br>L11 | 97<br>2D<br>L11 | 103<br>Δ | 98<br>3D<br>R12 |
|---|---|---|---|---|---|---|
| | | | (nH/cm) | | | |
| 0.001 | 12.775 | +21.0% | 15.460 | 9.7330 | +28.0% | 12.457 |
| 0.010 | 12.771 | +21.0% | 15.455 | 9.7297 | +28.0% | 12.456 |
| 0.100 | 12.459 | +17.7% | 14.659 | 9.4176 | –23.9% | 11.664 |
| 0.300 | 10.747 | +5.00% | 11.290 | 7.7074 | +7.60% | 8.2960 |
| 1.000 | 7.2076 | –3.40% | 6.9630 | 4.1821 | +4.70% | 3.9850 |
| 3.500 | 5.8716 | –1.17% | 5.8030 | 2.9088 | –0.54% | 2.8930 |
| 10.00 | 4.6294 | –1.20% | 5.5000 | 2.6586 | –0.36% | 2.6490 |
| Inf. | 4.6294 | –2.45% | 4.5160 | 2.4274 | –3.50% | 2.3430 |

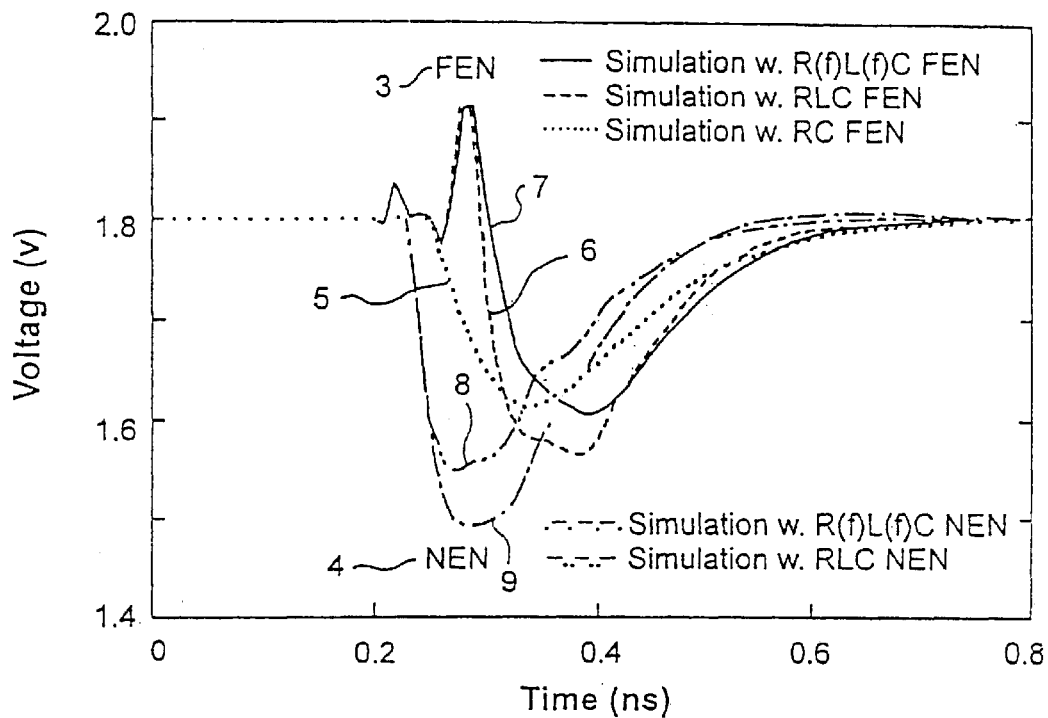
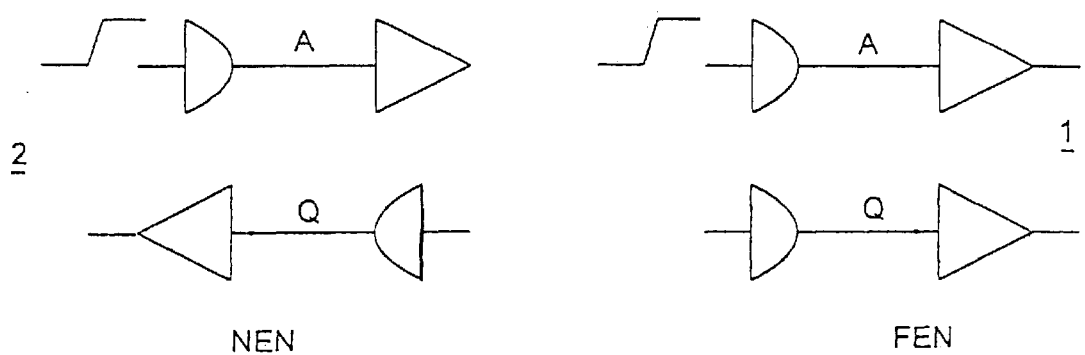
FIG. 1
(Prior Art)

RC, RLC, R(f)L(f)C CROSSTALK PREDICTION

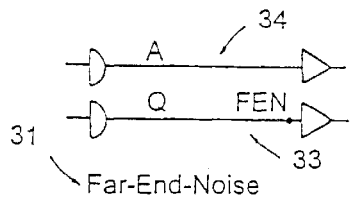

Far-End-Noise

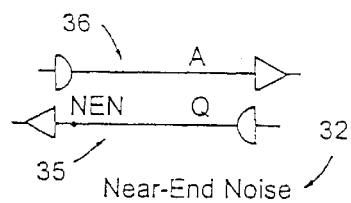

Near-End Noise

| | | | |
|---|---|---|---|
| 1.0 | for $\begin{cases} \frac{R1}{2Zo} < 1 \\ Zdrv \leq Zo \end{cases}$ | 1.0 | for $\begin{cases} \frac{R1}{2Z0} < 1 \\ Zdrv > Zo \end{cases}$ |
| | FEN (RC) < FEN (R(f)L(f)C) | | NEN (RC) ≅ NEN (RLC) |
| 2.0 | Otherwise | 2.0 | Otherwise |
| | FEN (RC) ≥ FEN (R(f)L(f)C) | | NEN (RLC) < NEN (R(f) L(f)C) |
| | FEN (RC) ≅ FEN (RLC) | | NEN (RC) << NEN (R(f)L(f)C) |
| 3.0 | Always | 3.0 | Always |
| | FEN (RLC) > FEN (R(f)L(f)C) | | NEN (RLC) < NEN (R(f) L(f)C) |
| | | | NEN (RC) < NEN (R(f)L(f)C) |

| Far-End Noise $\frac{R1}{2Zo} < 1$ | Near-End Noise $\frac{R1}{2Zo} < 1$ |
|---|---|
| 1.0   Zdrv > 1.5Zo | 1.0   NEN(RLC) - NEN (R(f)L(f)C) < 30% |
| FEN(RLC) - FEN (R(f)L(f)C) <25% | 2.0   Zdrv > 2Zo |
| FEN(RC) - FEN (R(f)L(f)C) <25% | NEN(RC) - NEN (R(f)L(f)C) < 35% |
| 2.0   Zo < Zdrv > 1.5Zo | 3.0   Zo < Zdrv > 1.5Zo |
| FEN(RLC) - FEN (R(f)L(f)C) <30% | NEN(RC) - NEN (R(f)L(f)C) < 60% |
| FEN(RC) - FEN (R(f)L(f)C) < 30% | 4.0   Zdrv < 0.5Zo |
| 3.0   Zdrv < 0.5Zo | NEN(RC) - NEN (R(f)L(f)C) < 75% |
| 30% < FEN (RLC)-FEN(R(f)L(f)C) < 80% | |
| 30% < FEN (RC)-FEN(R(f)L(f)C) < 80% | |

FIG. 3
(Prior Art)

SYNTHESIZED RLC(f) CIRCUIT FOR M5 HORIZONTAL COUPLING

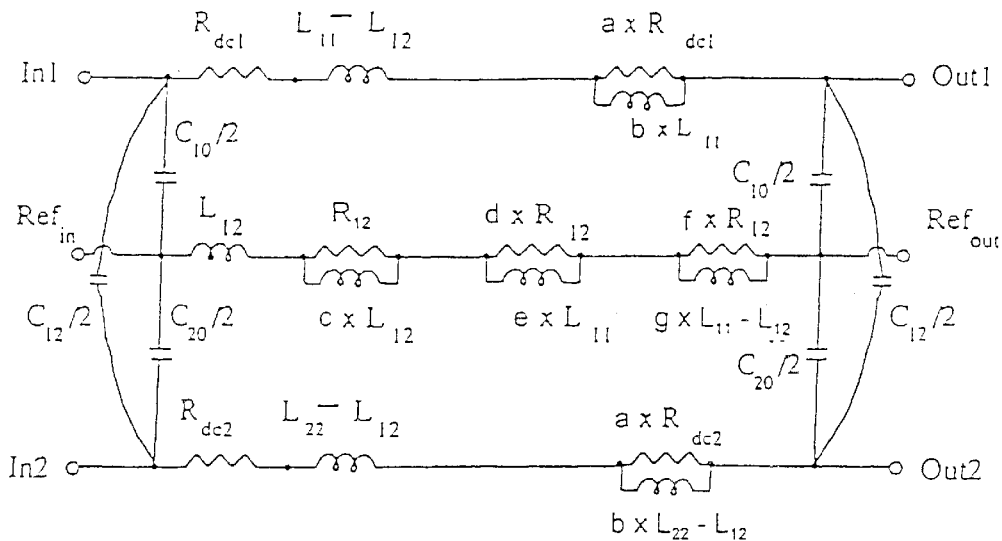

Variables a - g are Obtained from 3D Matrix Extraction

2D CONFIGURATION FOR L2D CALCULATION

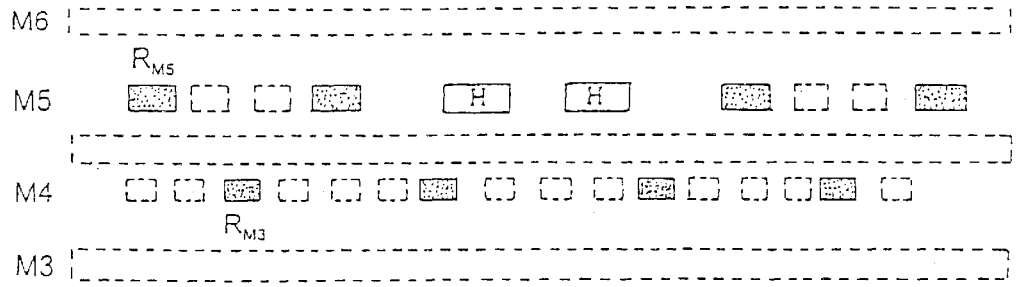

L are Obtained by Using scaling Variables m, n to Modify 2D Calculation
M, n are Obtained from 3D Matrix Extraction $L_{11} = m \times L_{11}2D$  $L_{12} = n \times L_{12}2d$  $L_{22} = m \times L_{22}2D$ R are Obtained from Direct Summation:

$R_{12} = (R_{M5} \parallel R_{M3}) / 4$

C are Obtained from 3D Extraction $C_{10} = C_{11} - C_{12}$  $C_{20} = C_{22} - C_{12}$

FIG. 6
(Prior Art)

7-Layer BEOL M7-M7 width=space=1.26um

| freq. (GHz) | 2D R11 | Δ | 3D R11 | 2D R12 | Δ | 3D R12 |
|---|---|---|---|---|---|---|
| | | | (ohm/cm) | | | |
| dc | 134.92 | | 134.92 | | | |
| 0.001 | 135.99 | +0.83% | 137.13 | 1.0734 | +11.3% | 1.1950 |
| 0.010 | 136.00 | +0.93% | 137.27 | 1.0826 | +17.2% | 1.2690 |
| 0.100 | 136.89 | +1.45% | 138.87 | 1.9620 | +46.4% | 2.8730 |
| 0.300 | 141.84 | +1.03% | 146.11 | 6.8913 | +46.3% | 10.080 |
| 1.000 | 153.06 | +2.13% | 156.33 | 17.835 | +12.1% | 19.993 |
| 3.500 | 161.84 | +1.62% | 164.46 | 24.986 | +5.60% | 26.373 |
| 10.00 | 171.07 | +1.03% | 176.33 | 29.458 | +12.0% | 32.990 |
| Inf. | Inf. | Inf. | Inf. | Inf. | Inf. | Inf. |

| freq. (GHz) | 2D L11 | Δ | 3D L11 | 2D L11 | Δ | 3D R12 |
|---|---|---|---|---|---|---|
| | | | (nH/cm) | | | |
| 0.001 | 12.775 | +21.0% | 15.460 | 9.7330 | +28.0% | 12.457 |
| 0.010 | 12.771 | +21.0% | 15.455 | 9.7297 | +28.0% | 12.456 |
| 0.100 | 12.459 | +17.7% | 14.659 | 9.4176 | +23.9% | 11.664 |
| 0.300 | 10.747 | +5.00% | 11.290 | 7.7074 | +7.60% | 8.2960 |
| 1.000 | 7.2076 | -3.40% | 6.9630 | 4.1821 | +4.70% | 3.9850 |
| 3.500 | 5.8716 | -1.17% | 5.8030 | 2.9088 | -0.54% | 2.8930 |
| 10.00 | 4.6294 | -1.20% | 5.5000 | 2.6586 | -0.36% | 2.6490 |
| Inf. | 4.6294 | -2.45% | 4.5160 | 2.4274 | -3.50% | 2.3430 |

FIG. 9

7-Layer BEOL M6-M6 width=1.26 um space=1.05 um

| freq. (GHz) | 2D R11 | Δ | 3D R11 | 2D R12 | Δ | 3D R12 |
|---|---|---|---|---|---|---|
| | | | (ohm/cm) | | | |
| dc | 134.92 | | 134.92 | | | |
| 0.001 | 162.21 | -1.20% | 160.27 | 27.287 | -7.1% | 25.350 |
| 0.010 | 162.21 | -1.20% | 160.27 | 27.287 | -7.1% | 25.350 |
| 0.100 | 162.23 | -1.20% | 160.30 | 27.298 | -7.0% | 25.370 |
| 0.300 | 162.41 | -1.10% | 160.56 | 27.386 | -6.9% | 25.500 |
| 1.000 | 164.31 | -1.00% | 162.90 | 28.315 | -5.4% | 26.795 |
| 3.500 | 176.27 | -0.40% | 175.56 | 34.370 | -3.2% | 33.270 |
| 10.00 | 195.03 | +2.40% | 199.77 | 43.733 | +2.4% | 44.759 |
| Inf. | Inf. | Inf. | Inf. | Inf. | Inf. | Inf. |

| freq. (GHz) | 2D L11 | Δ | 3D L11 | 2D L12 | Δ | 3D L12 |
|---|---|---|---|---|---|---|
| | | | (nH/cm) | | | |
| 0.001 | 5.2545 | +7.6% | 5.6528 | 2.5376 | -2.7% | 2.4688 |
| 0.010 | 5.2545 | -3.4% | 5.0759 | 2.5376 | -2.9% | 2.4650 |
| 0.100 | 5.2534 | -3.4% | 5.0734 | 2.5371 | -2.9% | 2.4635 |
| 0.300 | 5.2449 | -3.6% | 5.0538 | 2.5333 | -3.2% | 2.4530 |
| 1.000 | 5.1578 | -4.9% | 4.9050 | 2.4929 | -5.0% | 2.3660 |
| 3.500 | 4.6538 | -6.6% | 4.3456 | 2.2415 | -7.9% | 2.0638 |
| 10.00 | 4.1660 | -6.0% | 3.9132 | 1.9917 | -7.8% | 1.8355 |
| Inf. | 2.8566 | -4.2% | 2.7358 | 1.4925 | -9.4% | 1.3525 |

FIG. 10

EFFICIENT METHOD FOR MODELING THREE-DIMENSIONAL INTERCONNECT STRUCTURES FOR FREQUENCY-DEPENDENT CROSSTALK SIMULATION

BACKGROUND OF THE INVENTION

1. Field of the Invention

The present invention is directed to a method and system for computing the database of R(f), L(f), and C matrices for lossy interconnects that are used as the basis for CAD tools evaluating wiring delay and crosstalk in various electronic circuits and systems.

2. Description of Prior Art

It has been shown in A. Deutsch, H. Smith, C. W. Surovic, G. V. Kopcsay, D. A. Webber, G. A. Katopis, W. D. Becker, P. W. Coteus, A. H. Dansky, G. A. Sai-Halasz, "Frequency-dependent Crosstalk Modeling for On-chip Interconnections", Proceedings IEEE 7th Topical Meeting on Electrical Performance of Electronic Packaging, February, 1998, West Point, N.Y., pp. 35–38 that crosstalk evaluation on medium and long on-chip interconnections requires frequency-dependent R(f)L(f)C circuit representation. The traditional, lumped-circuit RC circuit underestimates crosstalk noise. A constant parameter RLC circuit will either under or over predict noise depending on line length and driver circuit size.

Typical examples of crosstalk noise predictions are shown in FIG. 1, where far-end (FEN) 3 and near-end (NEN) 4 crosstalk simulated with either FEN 1 or NEN 2 circuit topologies and using either distributed RC 5, RLC 6, 8, or R(f)L(f)C 7, 9 circuit representation are shown for 5-mm-long lines on layer M5.

Another example of crosstalk noise predictions is shown in FIG. 2, where simulated FEN 13, 14 and NEN 15, 16 crosstalk for $Z_{DRV}=Z_0$ and $Z_{DRV}=3Z_0$, are shown as a function of length for lines in layer M5. Both FIGS. 1 and 2 compare distributed RC, RLC, and R(f)L(f)C simulations.

The error in prediction can be in the range of 25–80% as tabulated in FIG. 3, which shows the results for both, FEN 31 and NEN 32 circuit topologies. In a FEN case 31, the noise is monitored at the far-end of the quiet line Q 33, which is farthest from the driving end on the active line A 34. The active and quiet lines have the drivers at the same near end. In the NEN case 32, the driver on 25 the quiet line 35 is at the far-end and the noise is monitored at the near end.

As shown in FIG. 4b, the error in the crosstalk prediction is caused by "proximity effect" around the signal conductors. Due to the sparse $V_{DD}$ and GND conductors available on chip, at high-frequency, current crowds around the conductors and the effective ground resistance $R_{12}$ 42 increases significantly.

The skin-effect, as seen from FIG. 4a, where $R_{10}$ 41 is shown to have very small rise with frequency, is not significant. The skin depth is $$\delta=1.0–1.5 \ \mu m \text{ at } +25° \text{ C.}$$

and $$0.4–0.6 \ \mu m \text{ at } -160° \text{ C.}$$

As described in A. Deutsch, G. V. Kopcsay, V. A. Ranieri, J. K. Catald, E. A. Galligan, W. S. Graham, R. P. McGouey, S. L. Nunes, J. R. Paraszczak, J. J. Ritsko, R. J. Serino, D. Y. Shih, J. S. Wilszynski, "High-speed propagation on lossy transmission lines", IBM Journal research and Develop., vol. 34, No. 4, pp.601–615, July 1990, the skin-effect would be fully developed if $$\delta \leq 0.1t, \text{ where t is the conductor thickness.}$$

In the example shown in FIGS. 4a, 4b, t=2.1 μm. Due to the strong variation of $R_{12}$ 42 with frequency, the resultant current redistribution in the ground lines causes $L_{12}$ 44 to also show substantial variation. The $L_{10}$ 43 term, however, has very little decrease and thus the inductive coupling, $$K_L=L_{12}/L_{11}, \text{ where } L_{11}=L_{10}+L_{12}$$

will decrease with frequency. In the example shown, $K_L$ decreases from 0.65 to 0.41 for f=0.001 and f=10 GHz. $K_L$ is not constant as assumed in an RLC-circuit representation or zero as assumed in an RC case.

The signals propagated on long, critical interconnects, such as data buses between the CPU and the cache, have rise times of $$t_r=50–100 \text{ ps.}$$

If these interconnects are viewed as low-pass filters having an "upper-3dB" frequency of $$f_c=\frac{1}{2}\Pi RC,$$

as explained in J. Millman, H. Taub, "Pulse, Digital, and Switching Waveforms", Chapter 2, pp.27–50, McGraw-Hill Book Co., NY, 1965, then $$t_r=0.35/f_c, \text{ and } f_c=3.5–7.0 \text{ GHz.}$$

The upper frequency range of interest is then 3.5–7 GHz, which is where most of the increase in $R_{12}$ and decrease of $L_{12}$ is shown. The slight increase in $R_{10}$ and decrease of $L_{10}$ will cause attenuation of the noise and variation in the series impedance of the line $$Z(\omega)=R+j\omega L, \text{ where } \omega=2\Pi f.$$

The variation in impedance affects the amplitude of the noise which travels in both directions on the quiet line, is reflected from the end devices, i.e., driver or receiver, and depends on the mismatch between $Z_{DRV}$ and $Z(\omega)$.

All these affects are not captured by RC or RLC circuit and hence contribute to the errors shown in FIG. 3. In FIG. 4a, ωL 45 is shown to exceed $R_{10}$ 41 for f>0.8 GHz and therefore inductance has to be taken into account. This is why the RC circuit is in so much error. The RLC circuit assumes a constant $K_L$ and no attenuation. Only the R(f)L(f)C circuit is able to capture all the effects.

The R(f), L(f), and C matrices are used to synthesize a resection distributed circuit which represents the calculated frequency-dependent behavior of the series impedance $Z(\omega)$ and shunt admittance $Y(\omega)=j\omega C$. FIGS. 5a, 5b show examples of calculated parameters $R_{11}=R_{10}+R_{12}$ and $R_{12}$ obtained from accurate three-dimensional calculations and predicted by the synthesized circuit. Very good agreement can be obtained. Such a distributed circuit using the sub-section 53 shown in FIG. 5c is used in simulations to predict the crosstalk noise.

A technique for implementing this synthesis approach in a very efficient manner in a CAD tool is described in B. J. Rubin, S. Daijavad, "Calculation of Mullti-Port Parameters of Electronic Packages Using a General Purpose Electromagnetic Code", Proceedings of the 2nd IEEE Topical Meeting on Electrical Performance of Electronic Packaging, EPEP'93, Oct. 20–22, 1993, Monterey, Calif., pp.37–39.

FIG. 6 highlights the key parameters used to translate from the table to a fast simulator, which is part of the CAD tool, which relies on pre-calculated RLC matrices stored in large tables. These R(f), L(f), and C matrices are obtained from three-dimensional, 3D, calculations that are very lengthy.

One net topology, such as shown in FIG. 6, requires 40–60 hours of CPU time. A typical 7-layer on-chip wiring structure requires 31 such nets to be calculated and the database build up can take as long as two-and-a-half months. Any design or technology ground rule changes require a new set of calculations, thus lengthening the design cycle for bringing the microprocessor chip to market with subsequent significant loss of revenue.

SUMMARY OF THE INVENTION

The invention presents a technique for greatly reducing the time required for generating the large RLC look-up tables needed for the CAD tool that performs crosstalk violation checking on on-chip wiring. The technique relies on two-dimensional, 2D, or two-plus a fast three-dimensional 2D/3D, calculation of the circuit parameters. This allows a reduction of computation time from 40–60 hours to 20 minutes to 2 hours per net. The loss in accuracy is insignificant while the design productivity and product competitiveness is greatly increased.

BRIEF DESCRIPTION OF DRAWINGS

The foregoing objects and advantages of the present invention may be more readily understood by one skilled in the art with reference being had to the following detailed description of a preferred embodiment thereof, taken in conjunction with the accompanying drawings wherein like elements are designated by identical reference numerals throughout the several views, and in which:

FIG. 1 is a graph of FEN and NEN crosstalk simulated with either FEN or NEN circuit topologies and using either distributed RC, RLC, or R(f)L(f)C circuit representation for 5-mm-long lines on layer M5.

FIG. 3 is a table of the conditions and error levels obtained for when R(f)L(f)C circuit representation has to be taken into account for crosstalk prediction.

FIG. 6 is a schematic of steps involved in the CAD tools to translate from an actual configuration to an R(f)L(f)C circuit using only simple parameters and a table look-up approach.

FIG. 9 is a table of calculated $R_{11}$, $R_{12}$, $L_{11}$, and $L_{12}$ for an M7-layer case, as a function of frequency, and using 2D and 3D modeling.

FIG. 10 is a table of calculated $R_{11}$, $R_{12}$, $L_{11}$, and $L_{12}$ for an M6-layer case, as a function of frequency, and using 2D and 3D modeling.

DETAILED DESCRIPTION OF THE INVENTION

The inventive technique is explained in terms of analyzing interconnects on the topmost layers of a seven layer wiring structure. This is exemplary only and not limiting.

Figure 2A:
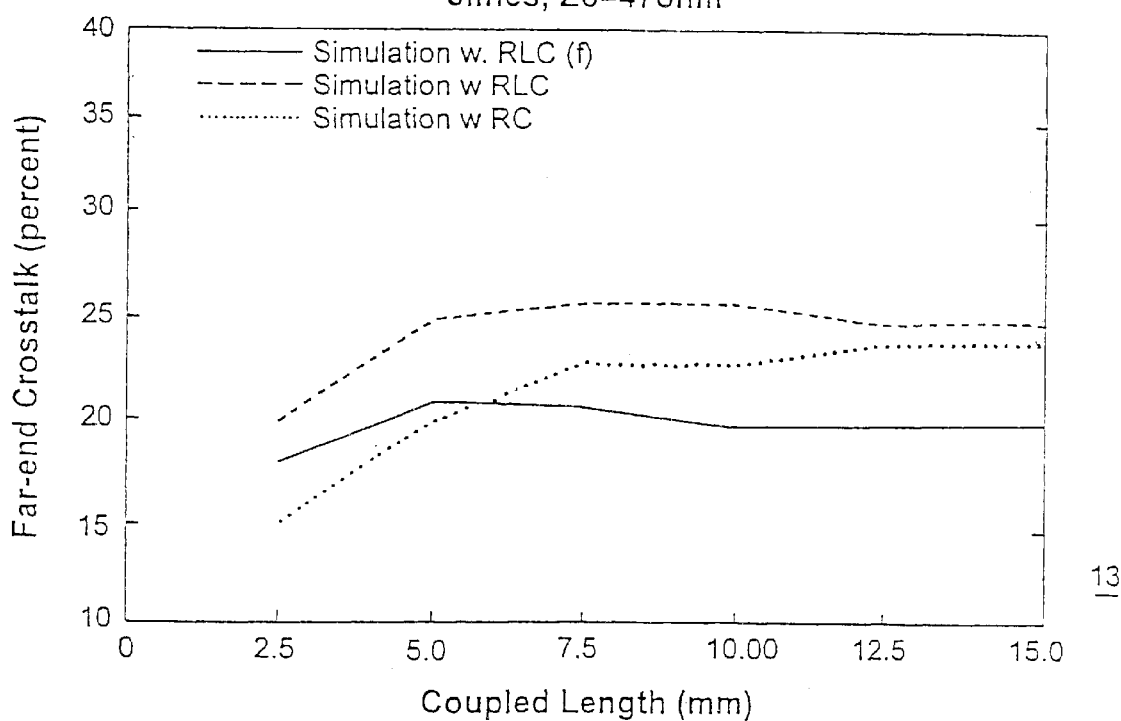
FIG. 2 is a graph of simulated FEN and NEN crosstalk for $Z_{DRV}=Z_0$ and $Z_{DRV}=3Z_0$ and as a function of length for lines in layer M5.
Figure 2B:
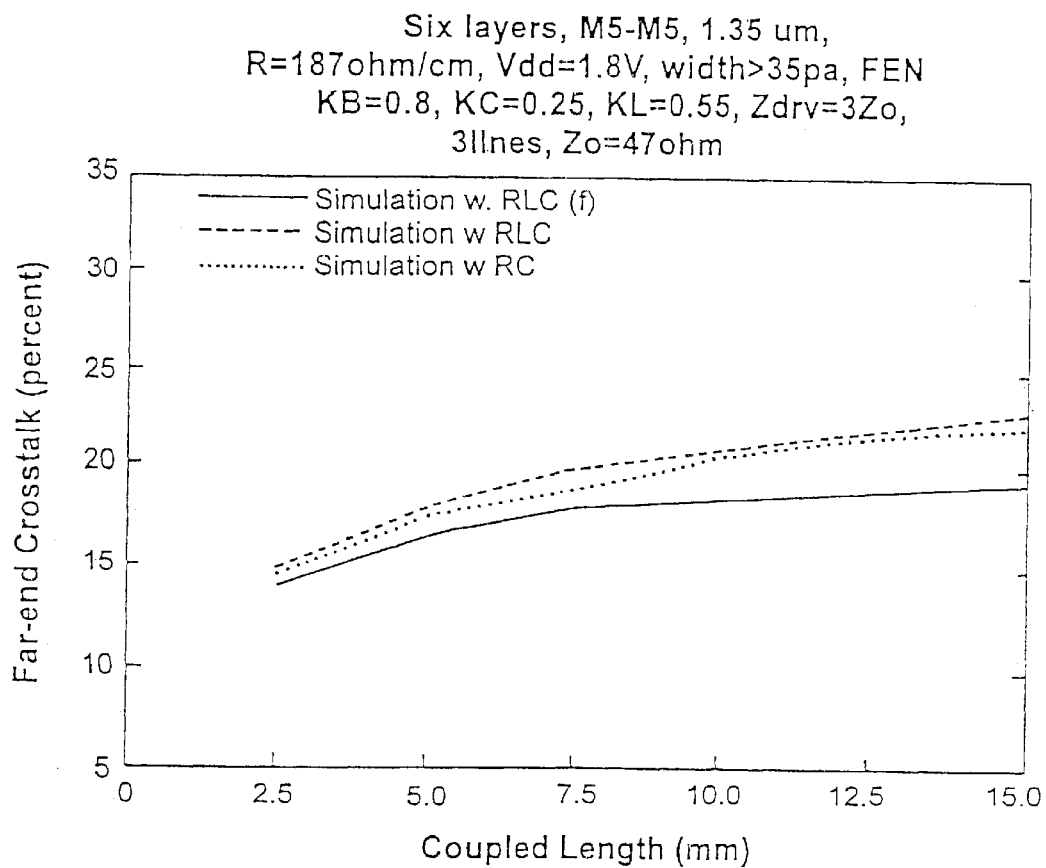
Figure 2C:
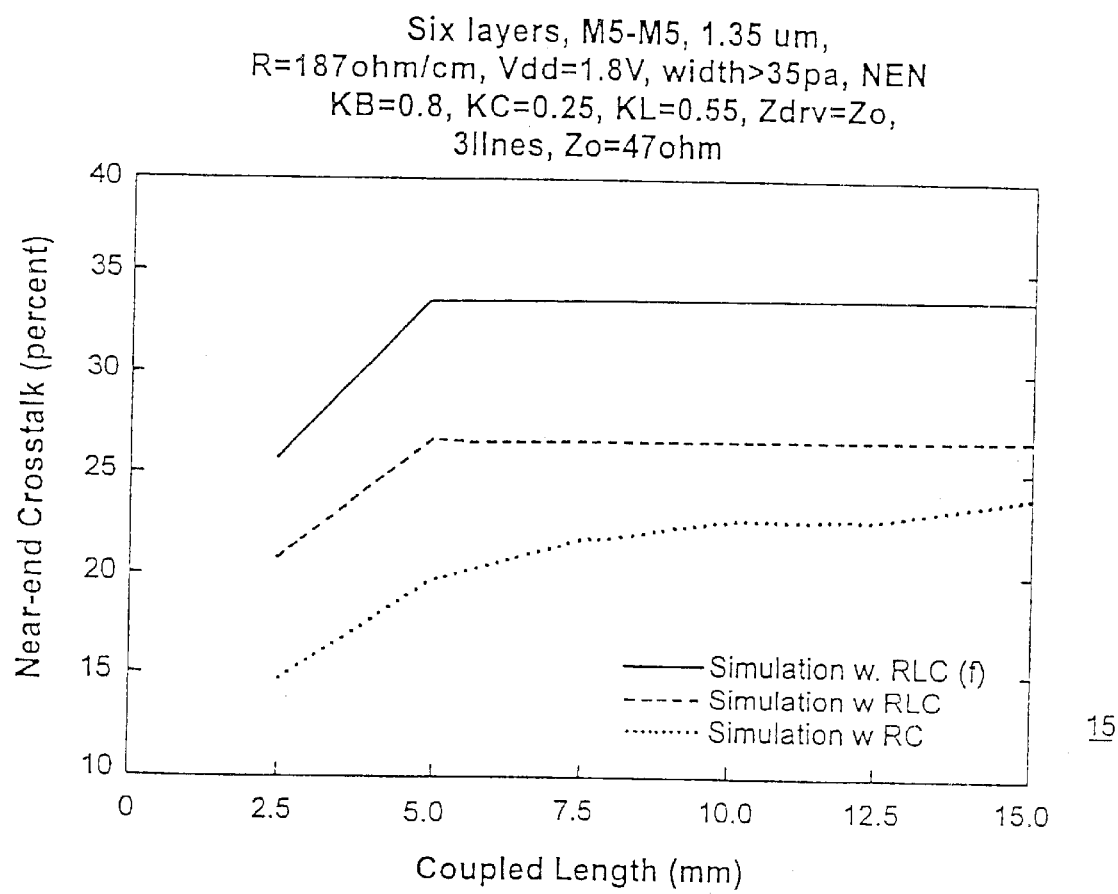
Figure 2D:
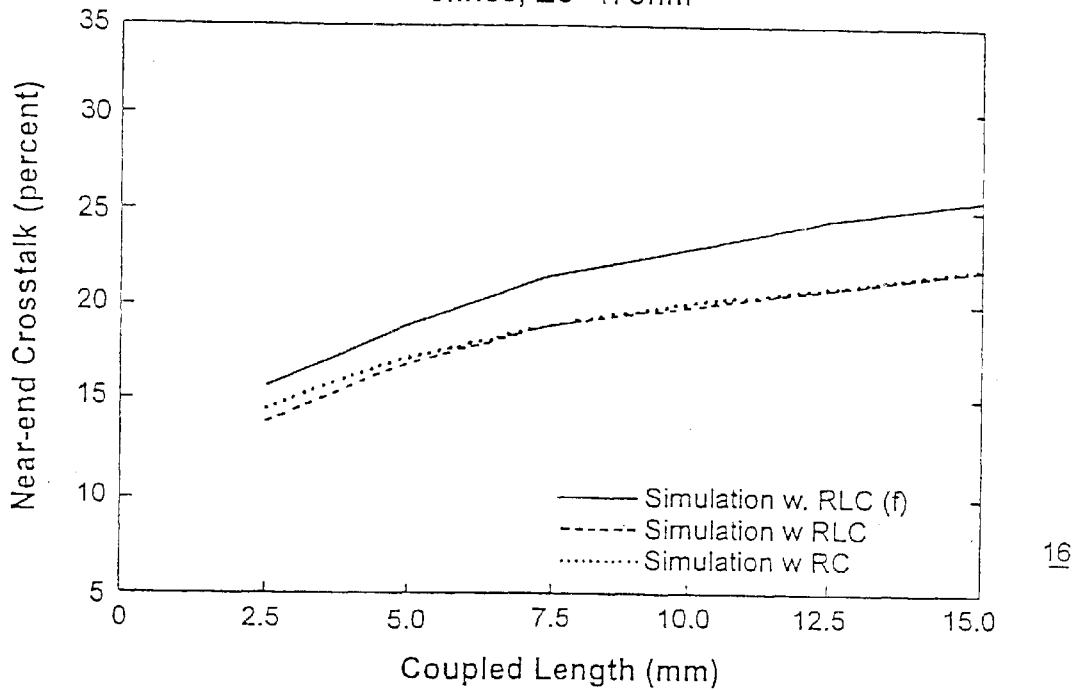
Figure 2E:
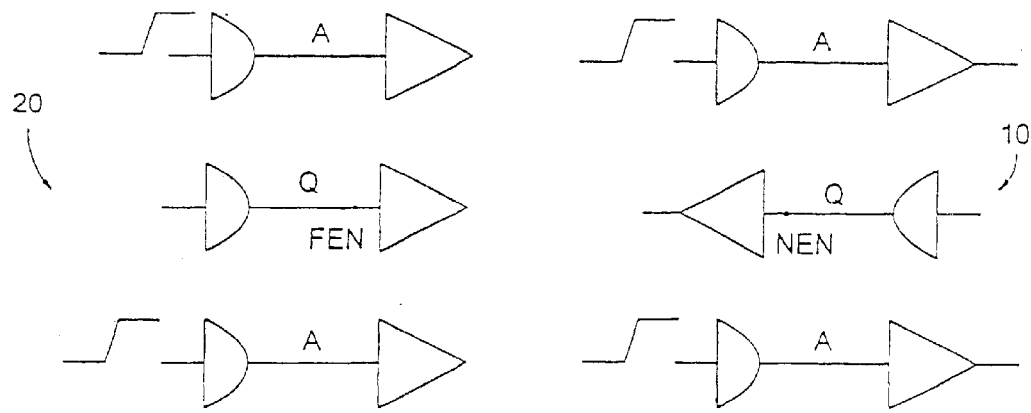
Figure 4A:
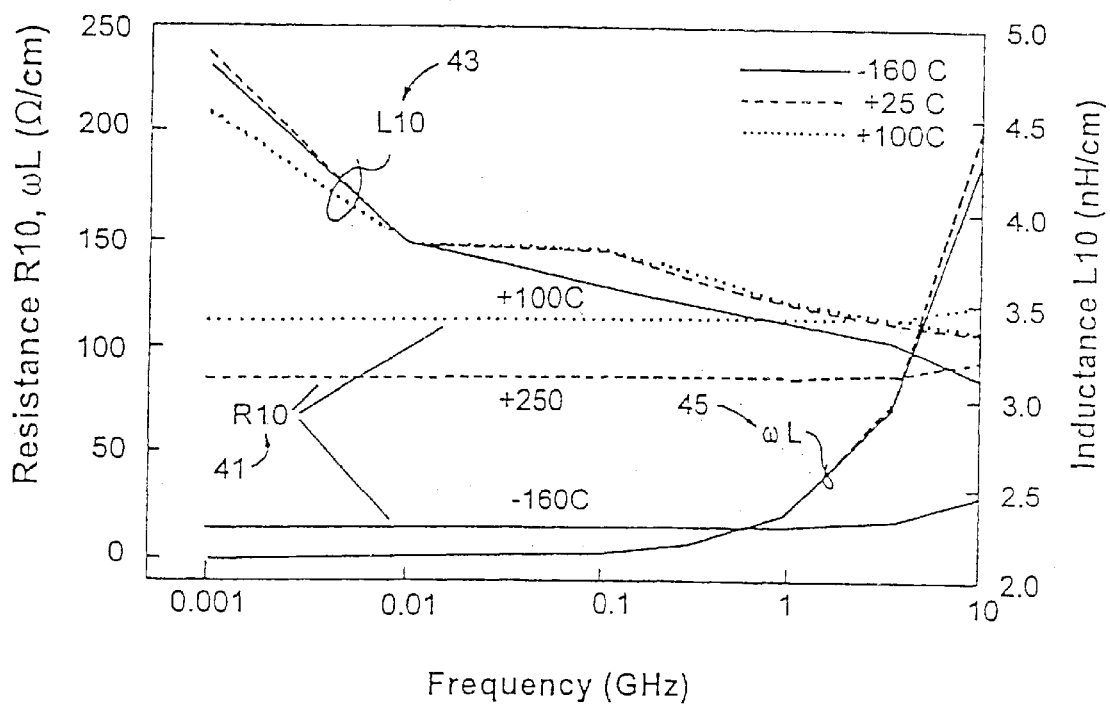
FIGS. 4(a,b) illustrate graphs of variation of $R_{10}$, $L_{10}$, and $\omega L$ with frequency and temperature for lines on layer M6.
Figure 4B:
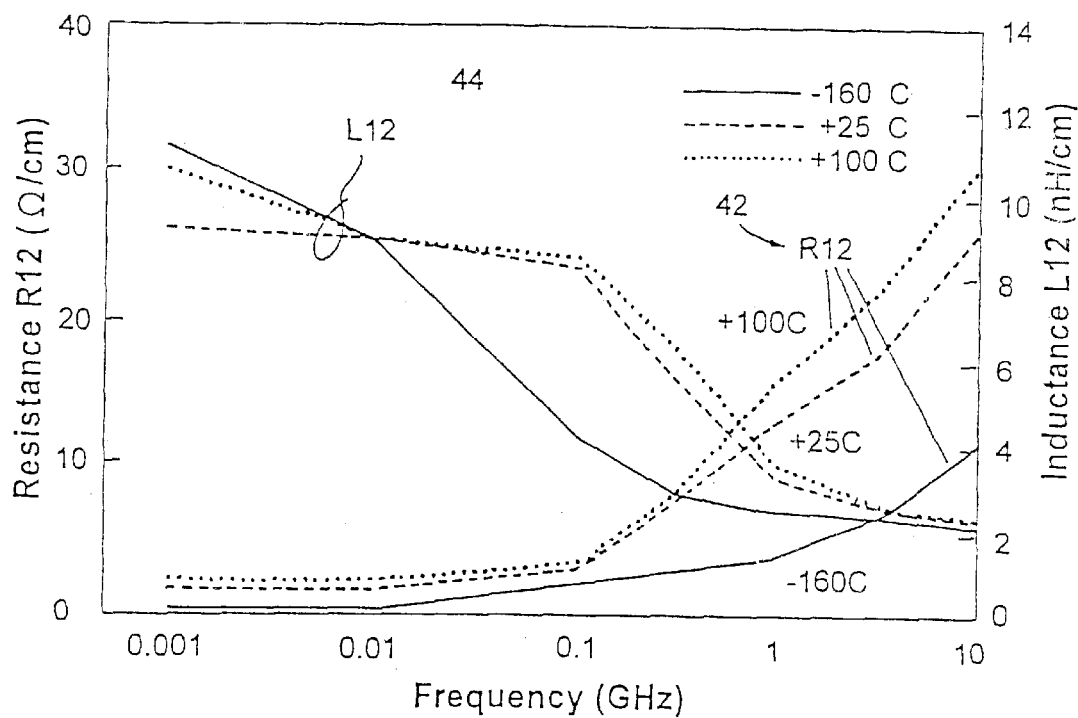
Figure 5A:
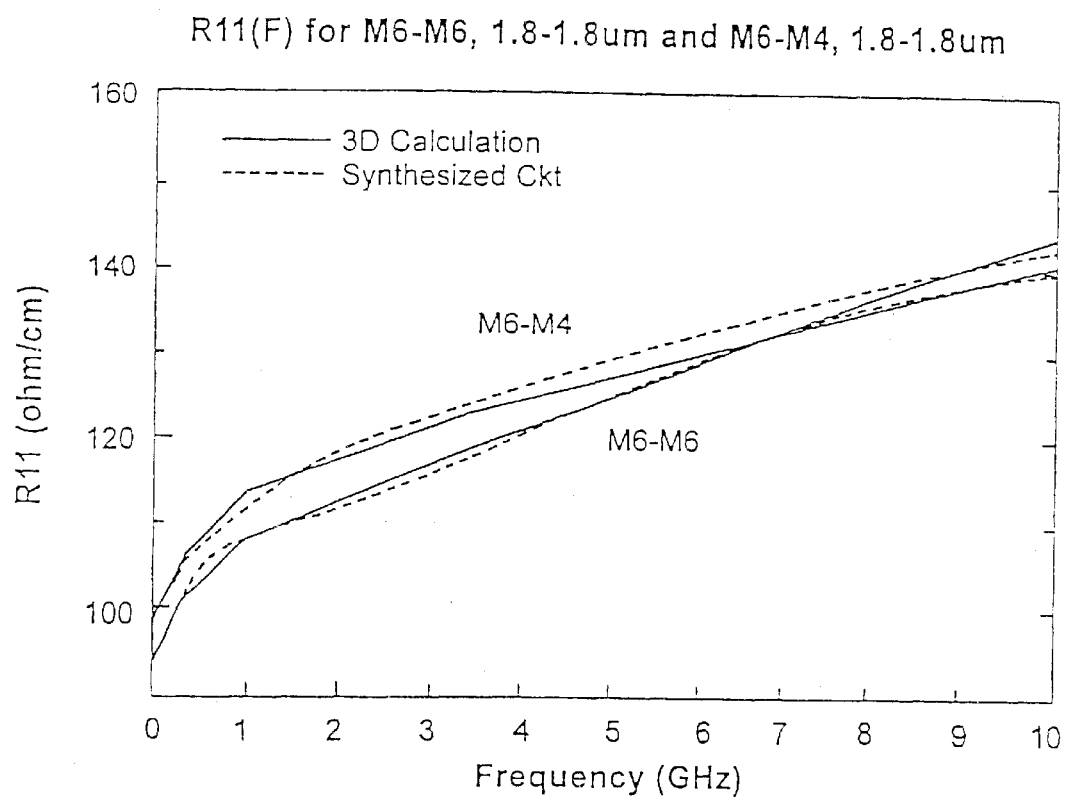
FIGS. 5(a) and (b) illustrate graphs of calculated and synthesized $R_{11}$ and $R_{12}$ parameters for layers M6 and M5, and for in-plane and vertical coupling cases.
Figure 5B:
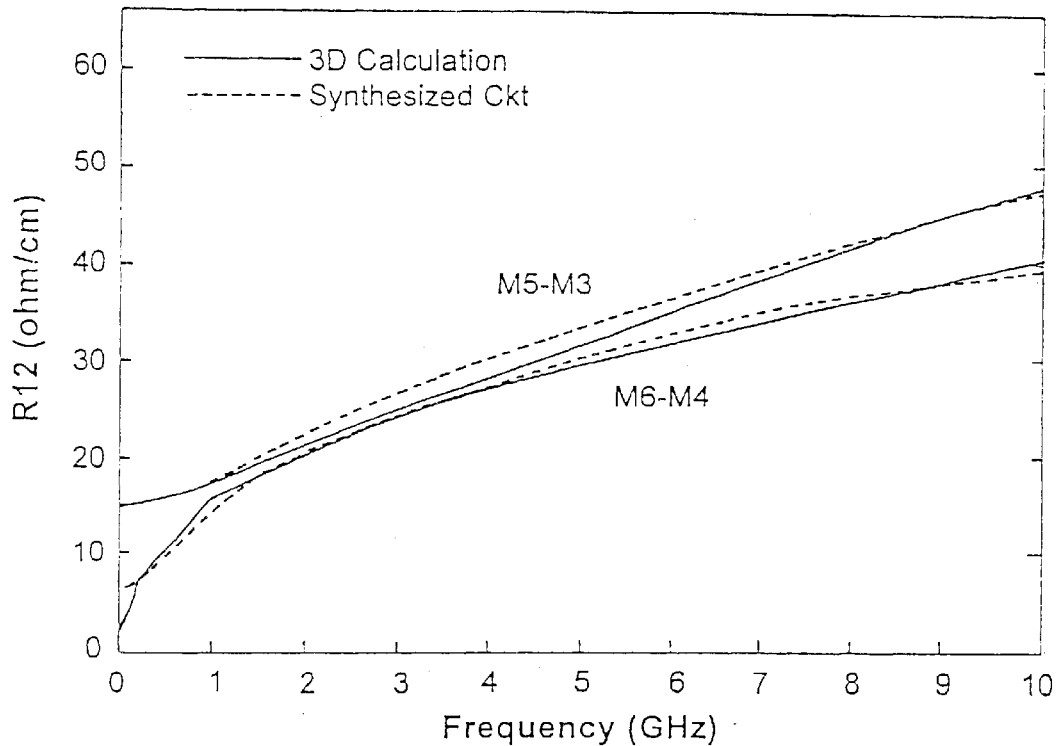
FIG. 5(c) is a schematic presentation of one subsection of the distributed resection circuit used in the simulation.
Figure 5C:
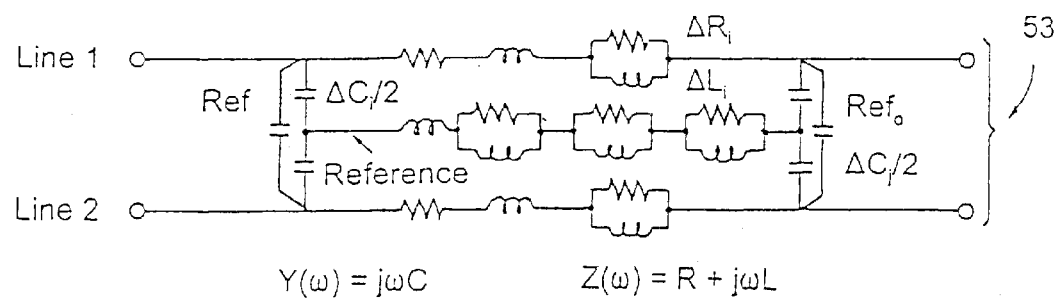
Figure 7:
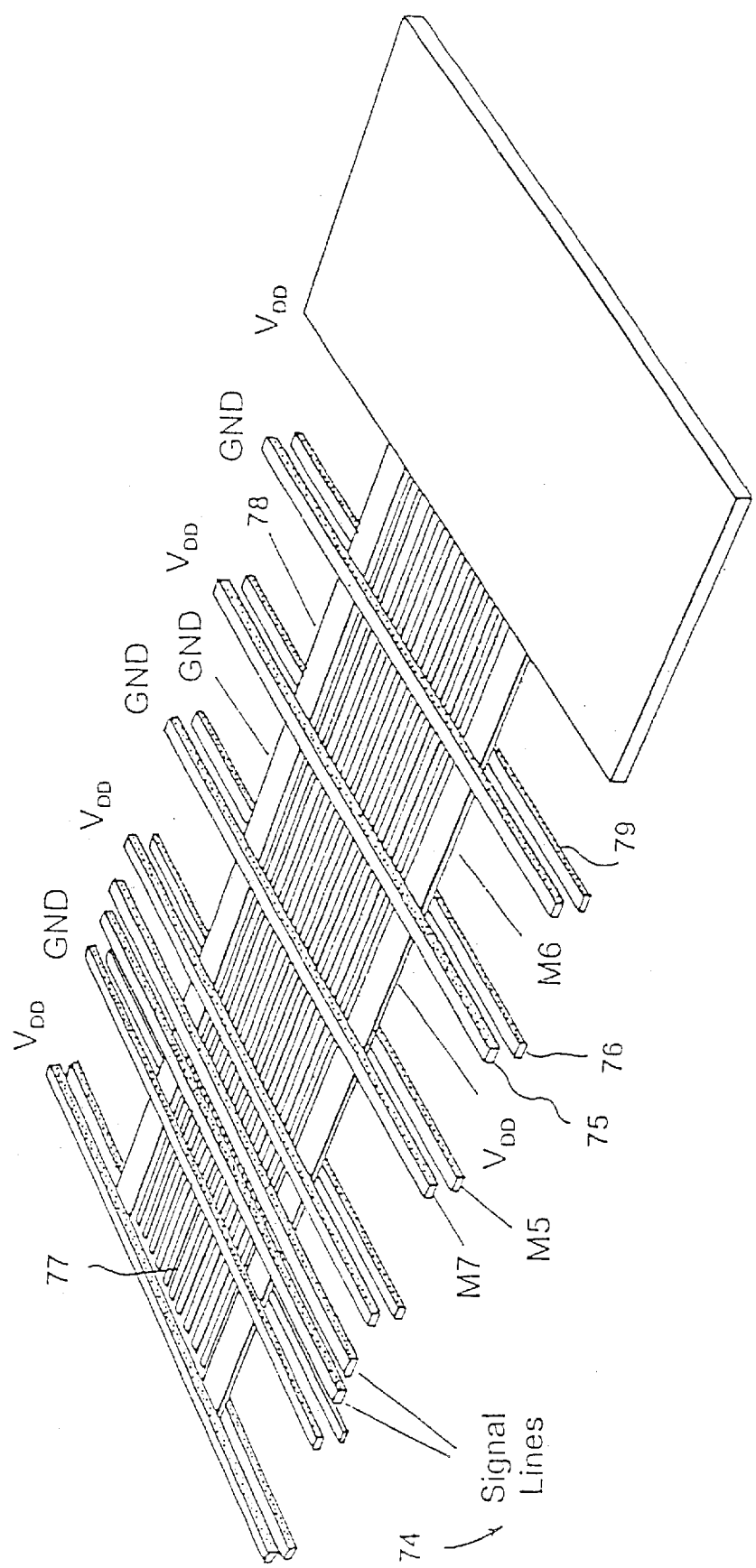
FIG. 7 is a typical three-dimensional model used for two coupled lines on layer M7 in order to calculate the R(f), L(f), and C matrices.

FIG. 7 shows a typical three-dimensional model required for one net of two coupled lines placed on the top seventh layer 74. The model includes in-plane $V_{DD}$ and GND conductors 75 and parallel $V_{DD}$ and GND conductors 76 on the fifth layer M5, two layers below. In addition, orthogonal conductors on the sixth layer M6 are also included. These are orthogonal signal wires 77 and orthogonal $V_{DD}$ and GND conductors 78. All the $V_{DD}$ and GND conductors are interconnected with vias at the overlapping locations 79. In FIG. 7, a full-wave electromagnetic parameter extractor is used, of the type described in a commonly owned, co-pending U.S. Patent application entitled "System and Method for Reducing Calculation Complexity of Lossy, Frequency-Dependent Transmission-Line Computation", filed on Aug. 26, 1998, the whole contents disclosure of which are incorporated herein by reference as is fully set forth herein.

Figure 8:
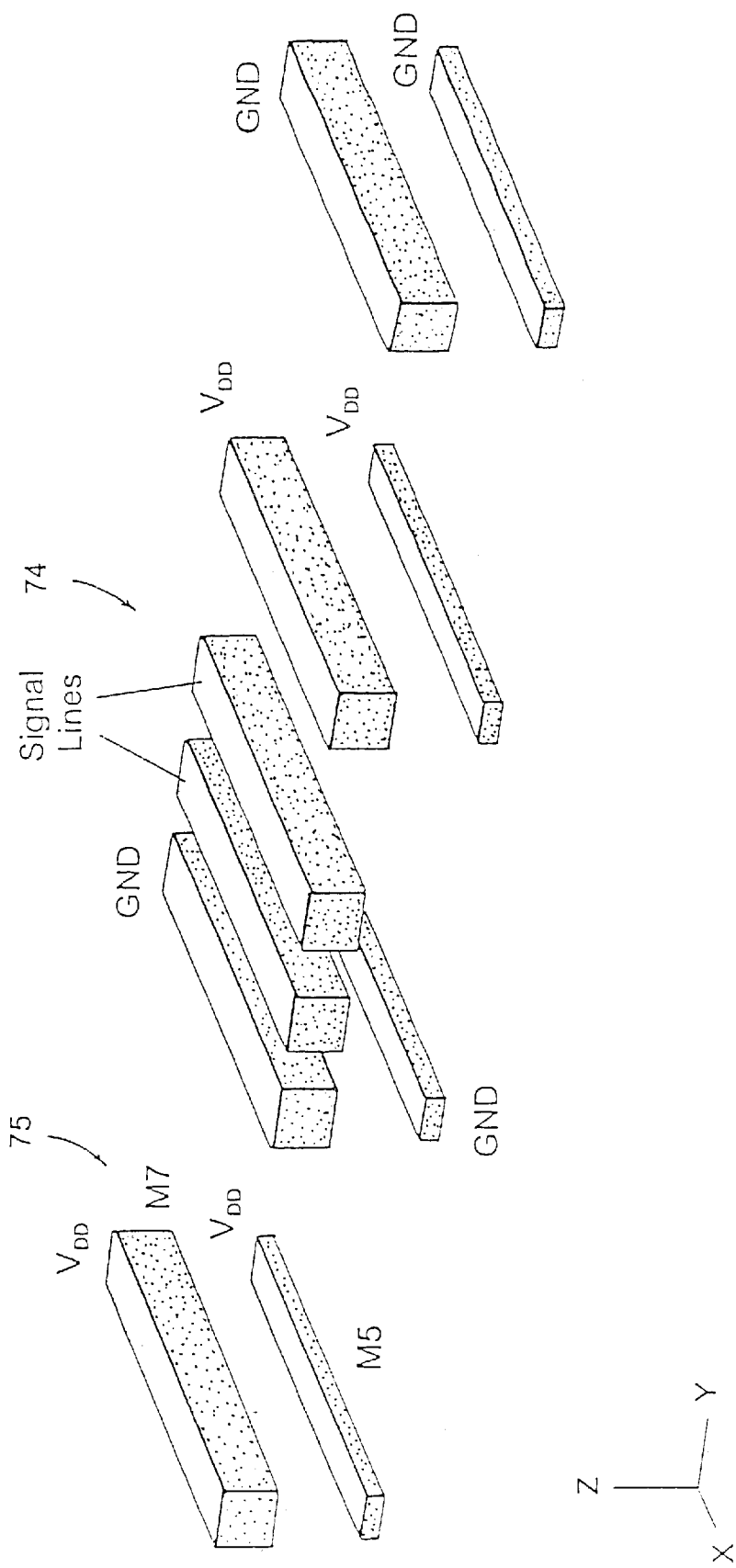
FIG. 8 is a 2D model for the typical three-dimensional model presented in FIG. 7.

FIG. 8 shows a close-up of a two-dimensional model. In this case, all the orthogonal conductors of FIG. 7 are omitted. The model shown in FIG. 8 is used in a two-dimensional extractor such as described in W. T. Weeks, L. L. Wu, M. F. McAllister, and A. Singh, "Resistive and Inductive Skin Effect in Rectangular Conductors", IBM Journal Res. and Develop., vol. 23, pp.652–660, 1979. In a two-dimensional analysis, all the VDD and GND conductors 75 are ideally assumed to be at the same potential. In the 3D model, the orthogonal $V_{DD}$ and GND conductors perform this task. This adds resistance in the equivalent $R_{12}$ path. The current distribution is also somewhat different which in turn will have some slight effect on $R_{12}$. The absence of the orthogonal signal wiring in the 2D model is not expected to change the self and mutual inductances $L_{11}$ and $L_{12}$.

FIGS. 9 and 10 show two representative calculations for wiring in layers M7 and M6. The tables show the $R_{11}$, 91, 92, $R_{12}$ 93, 94, $L_{11}$ 95, 96, and $L_{12}$ 97, 98 parameters calculated using either a 2D or 3D model as shown in FIGS. 8 and 7 respectively, and the percentage difference between these results 100–103 as a function frequency. The largest differences are shown at very low frequencies. These components are not that significant since they will have small energy in the noise signal spectrum. Noise pulses, as seen in FIG. 1, have mostly high-frequency components, i.e., narrow peaks with sharp rising and falling edges. Moreover, the difference between 2D and 3D calculation is varying with frequency and one simplifying factor cannot be used.

Figure 11:
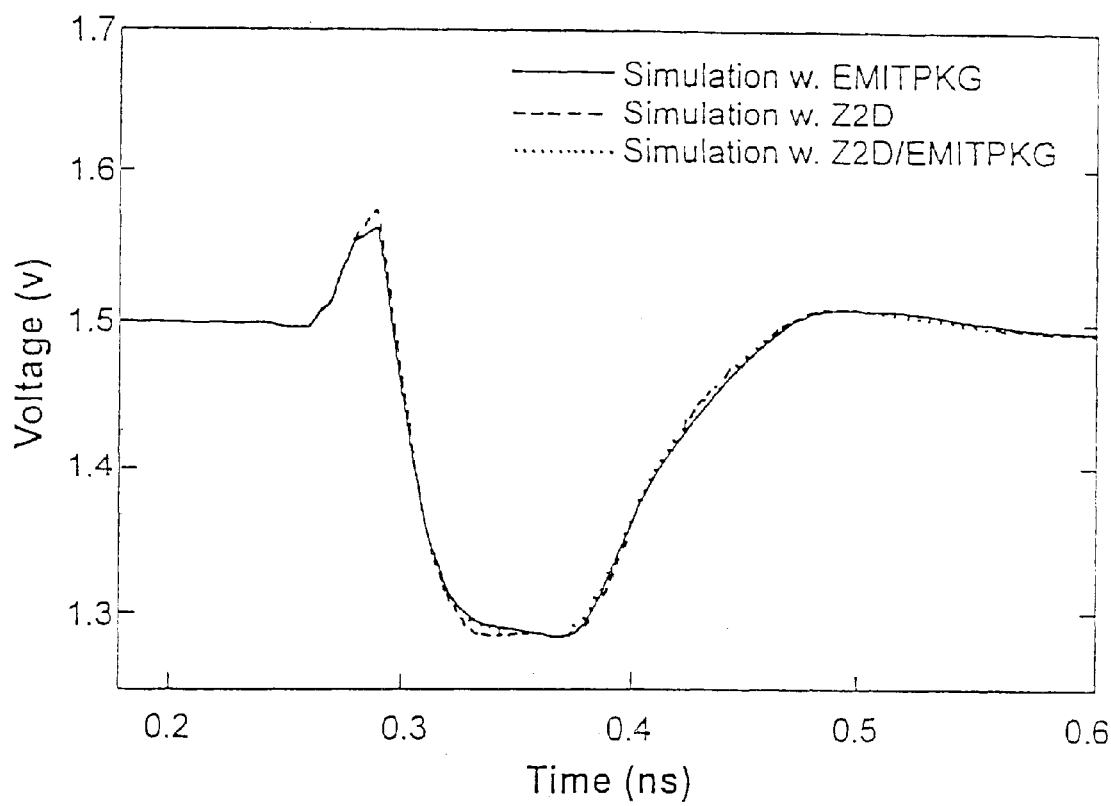
FIG. 11 is a graph of simulated FEN noise for the M7 lines of the table presented in FIG. 9, using 3D, 2D, and 2D/3D modeling.
Figure 12:
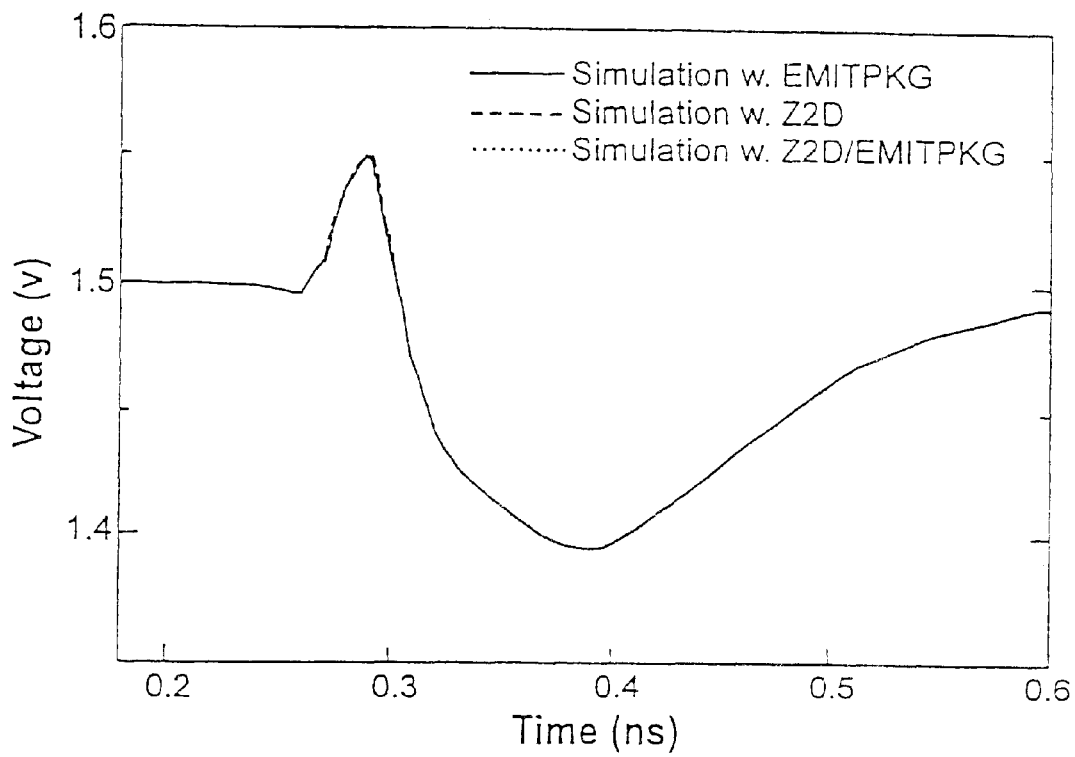
FIG. 12 is a graph of simulated FEN noise for the M6 lines of the table presented in FIG. 10 using 3D, 2D, and 2D/3D modeling.

FIGS. 11 and 12 show representative crosstalk waveforms in a FEN configuration of simulations performed with actual driver and receiver circuits to assess the impact of these discrepancies. The figures indicate the noise amplitude for NEN configurations as well. Three options are compared, namely using 1. a three dimensional modeling EMITPKG 110,
2. a two dimensional Z2D 120, and
3. a hybrid 2D/3D labeled Z2D/EMIT 130.

In the hybrid option approach, the 2D R(f) and L(f) matrices are calculated from low frequency (f=0.001 GHz) to the upper frequency of interest, f=10 GHz. The infinite frequency value is calculated with a 3D model.

The 2D calculation requires 20–40 minutes of CPU time depending on the speed of the workstation used. The hybrid 2D/3D calculation adds a typical 90-minute run time with a total of about two hours. The 3D run time is 40–60 hours depending on which signal layer is being modeled. The saving factors are then in the order of 25:1 and 100:1 per net. For a complete table for seven-layer structure, the calculation would go from 75 days to 1 day or 3 days for 2D or 2D/3D options, respectively. FIGS. 11 and 12 show that the prediction error is in the order of 0.4–1.9% for the 2D case and −1.2 to 0.9% for the 2D/3D case. Both options are considered extremely viable given all the other processing tolerances and modeling uncertainties present in actual chip wirings.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

Having thus described our invention, what we claim as new, and desire to secure by Letters Patent is:

1. A method for reducing the computation time for modeling the frequency dependent crosstalk needed in designing high-performance integrated circuit chips, the method comprising the steps of:

creating a 2 dimensional model of a plurality of on-chip conductors arranged in 3 dimensions by omitting all orthogonal conductors;

breaking-up an interconnection of said plurality of on-chip conductors into a group of constituent parts that have a restricted topology;

calculating one or more R(f) and L(f) matrices containing frequency dependent parameters of said 2 dimensional model;

synthesizing a unique distributed network for each of said parts;

associating an R matrix and an L matrix with each of said synthesized distributed networks; and simulating crosstalk of said interconnection on the basis of said calculated R(f) and L(f) matrices and eliminating failures due to crosstalk noise in said conductors.

2. The method of claim 1, wherein said R(f) and said L(f) matrices are calculated for a 2 dimensional model, where f ranges from a low frequency of 0.001 GHz to a high frequency of 10 GHz and 2 dimensional $L_\infty$.

3. The method of claim 1, wherein said 2 dimensional R(f) and said 2 dimensional L(f) matrices are calculated for a hybrid 2 dimensional/3 dimensional model, where f ranges from a low frequency of 0.001 GHz to a high frequency of 10 GHz and 3 dimensional $L_\infty$.

4. The method of claim 1, wherein said calculating step is used for fast generation of tables used for accurate crosstalk prediction on lossy on-chip interconnections.

5. The method of claim 4, wherein said distributed network is expressed in terms of $R_{dc}$ and $L_\infty$, said $L_\infty$ is an L at infinite frequency.

6. The method of claim 5, wherein said associating step uses parameters stored in said tables for translating R(f) and L(f) to $R_{dc}$ and $L_\infty$.

7. A computer program device readable by a machine, tangibly embodying a program of instructions executable by a machine to perform method steps for reducing the computation time for modeling the frequency dependent crosstalk needed in designing high-performance integrated circuit chips, the method comprising the steps of:

creating a 2 dimensional model of a plurality of on-chip conductors arranged in 3 dimensions by omitting all orthogonal conductors;

breaking-up an interconnection of said plurality of on-chip conductors into a group of constituent parts that have a restricted topology;

calculating one or more R(f) and L(f) matrices containing frequency dependent parameters of said 2 dimensional model;

synthesizing a unique distributed network for each of said parts;

associating an R matrix and an L matrix with each of said synthesized distributed networks; and simulating crosstalk of said interconnection on the basis of said calculated R(f) and L(f) matrices and eliminating failures due to crosstalk noise in said conductors.

8. The method of claim 7, wherein said R(f) and said L(f) matrices are calculated for a 2 dimensional model, where f ranges from a low frequency of 0.001 GHz to a high frequency of 10 GHz and 2 dimensional $L_\infty$.

9. The method of claim 7, wherein said 2 dimensional R(f) and said 2 dimensional L(f) matrices are calculated for a hybrid 2 dimensional/3 dimensional model, where f ranges from a low frequency of 0.001 GHz to a high frequency of 10 GHz and 3 dimensional $L_\infty$.

10. The method of claim 7, wherein said calculating step is used for fast generation of tables used for accurate crosstalk prediction on lossy on-chip interconnections.

11. The method of claim 10, wherein said distributed network is expressed in terms of $R_{dc}$ and $L_\infty$, said $L_\infty$ is an L at infinite frequency.

12. The method of claim 11, wherein said associating step uses parameters stored in said tables for translating R(f) and L(f) to $R_{dc}$ and $L_\infty$.

* * * * *

UNITED STATES PATENT AND TRADEMARK OFFICE
CERTIFICATE OF CORRECTION

PATENT NO. : 6,418,401 B1  Page 1 of 1
DATED : July 9, 2002
INVENTOR(S) : Allan H. Dansky et al.

It is certified that error appears in the above-identified patent and that said Letters Patent is hereby corrected as shown below:

<u>Title page,</u>
Item [57], ABSTRACT,
Line 3, "failures-due" should read -- failures due --

<u>Column 2,</u>
Line 52, "resection" should read -- π-section --

<u>Column 3,</u>
Line 51, "resection" should read -- π-section --

Signed and Sealed this

Fifteenth Day of April, 2003

JAMES E. ROGAN
*Director of the United States Patent and Trademark Office*